(12) United States Patent
Jankowski et al.

(10) Patent No.: US 12,273,082 B2
(45) Date of Patent: Apr. 8, 2025

(54) ISOLATED AMPLIFIERS WITH RECONFIGURABLE FILTER

(71) Applicant: TEXAS INSTRUMENTS INCORPORATED, Dallas, TX (US)

(72) Inventors: Maciej Jankowski, Munich (DE); Roland Bucksch, Buch am Erlbach (DE)

(73) Assignee: Texas Instruments Incorporated, Dallas, TX (US)

( * ) Notice: Subject to any disclaimer, the term of this patent is extended or adjusted under 35 U.S.C. 154(b) by 345 days.

(21) Appl. No.: 17/868,072

(22) Filed: Jul. 19, 2022

(65) Prior Publication Data

US 2024/0030880 A1    Jan. 25, 2024

(51) Int. Cl.
*H03F 3/45* (2006.01)
*H03F 1/30* (2006.01)

(52) U.S. Cl.
CPC ......... *H03F 3/45645* (2013.01); *H03F 1/301* (2013.01); *H03F 2203/45526* (2013.01)

(58) Field of Classification Search
CPC ......... H03F 3/45; H03F 1/301; H03F 2203/45
See application file for complete search history.

(56) References Cited

U.S. PATENT DOCUMENTS

| | | | |
|---|---|---|---|
| 5,455,582 A | 10/1995 | Valdenaire | |
| 10,581,472 B2 * | 3/2020 | Ganci | H04B 1/0035 |
| 2011/0241916 A1 * | 10/2011 | Fletcher | H03F 3/45475 |
| | | | 341/122 |
| 2012/0212288 A1 * | 8/2012 | Masui | H03H 11/0427 |
| | | | 327/557 |
| 2016/0140376 A1 * | 5/2016 | Kremin | G06V 40/1306 |
| | | | 382/124 |
| 2020/0186110 A1 | 6/2020 | Murata | |
| 2020/0212857 A1 | 7/2020 | Murata | |
| 2021/0409041 A1 * | 12/2021 | Abbas Mohamed Helmy | H04B 1/0078 |
| 2022/0123748 A1 | 4/2022 | Willis et al. | |
| 2022/0354407 A1 * | 11/2022 | Hsu | A61B 5/301 |

OTHER PUBLICATIONS

International Search Report in corresponding PCT Application No. PCT/US2023/028031, mailed Nov. 7, 2023.

* cited by examiner

*Primary Examiner* — Patricia T Nguyen
(74) *Attorney, Agent, or Firm* — John R. Pessetto; Frank D. Cimino

(57) ABSTRACT

Examples of circuitry and systems and methods provide a multi-way configurable amplifier to support various applications. The multi-way configurable amplifier may include a reconfigurable filter that comprises first and second inputs adapted to receive an input signal; a fully differential amplifier (FDA); and first and second reconfigurable resistance-capacitance (RC) networks. The FDA has an inverting input, a non-inverting input, an inverting output, and a non-inverting output. The inverting input is coupled to the first input, and the non-inverting input is coupled to the second input. The first reconfigurable RC network is coupled to the non-inverting output, and the second reconfigurable RC network is selectively couplable to the inverting output. The reconfigurable filter is configurable to enable operation in any of multiple modes including a single-ended mode of operation and a differential mode of operation.

20 Claims, 6 Drawing Sheets

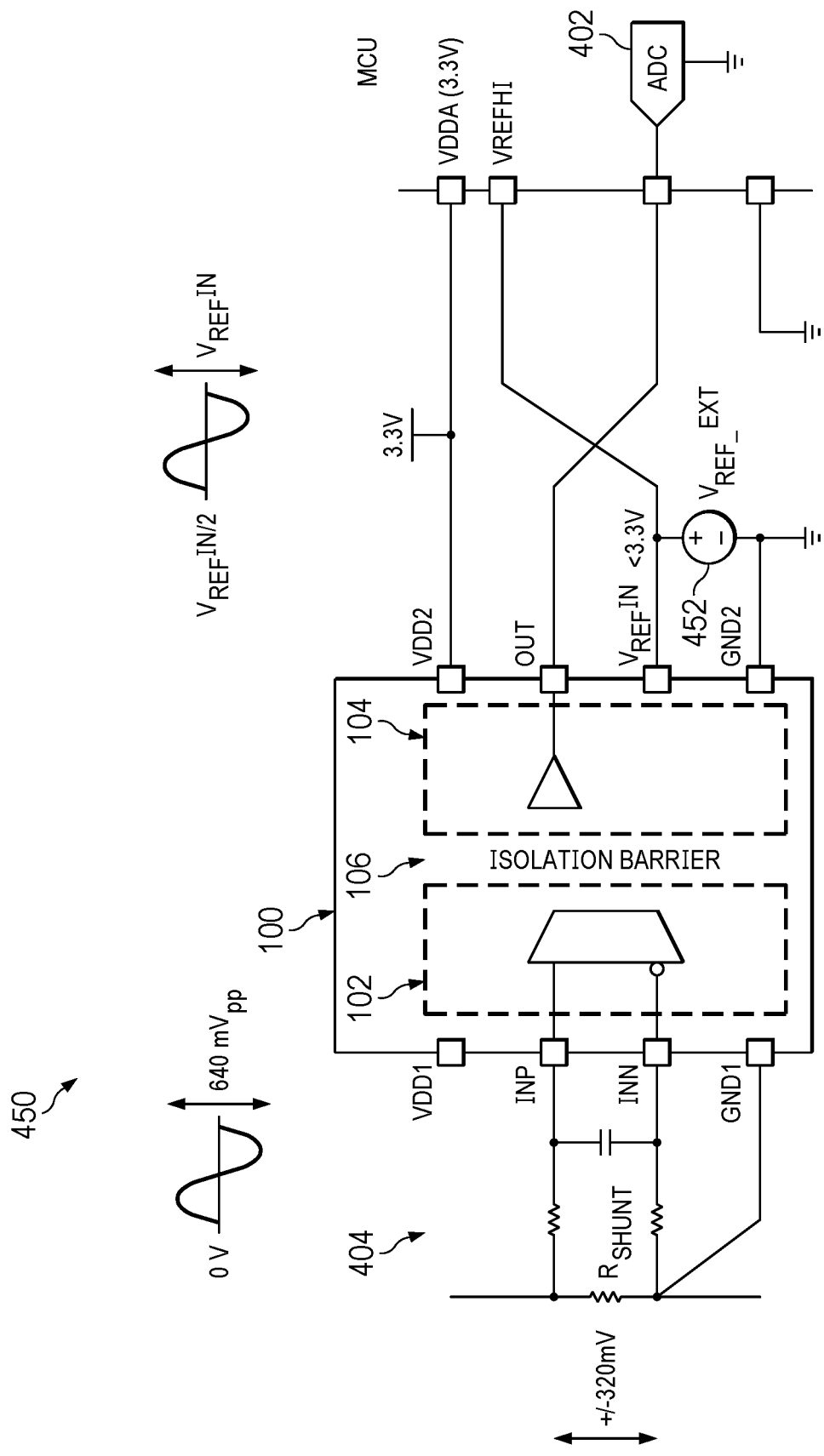

ISOLATED AMPLIFIERS WITH RECONFIGURABLE FILTER

FIELD OF DISCLOSURE

This disclosure relates generally to a reconfigurable filter to enable an isolated amplifier to operate in any of multiple modes including a fully differential mode, a single-ended mode in which a single-ended output is generated from a differential input, as well as unipolar modes, to support multiple different products, including direct interface with a single-input analog-to-digital converter (ADC).

BACKGROUND

An isolated amplifier has an output separated from the amplifier's input circuitry by an isolation barrier that can withstand high voltage. The isolation barrier separates parts of the system that operate on different common-mode voltage levels and protects the low voltage side from hazardous voltages and damage. The input of an isolated amplifier may be optimized for direct connection to a low-impedance shunt resistor or other low impedance voltage source with low signal levels. Applications such as isolated voltage or current sensing in various environments including automotive require excellent DC accuracy and low temperature drift.

Many isolated amplifiers used in such sensing applications provide a differential analog output between two output pins, which can interface with a differential input ADC. To interface with a single-ended-input ADC, however, such amplifier requires external circuitry to convert the amplifier output to a ground-referenced, singled-ended signal for input to the single-ended-input ADC. This external circuitry, however, requires additional space, increases complexity and adds cost to the overall product.

Another prior approach to interfacing an isolated amplifier with a single-ended-input ADC is to use to two such ADCs, one coupled to one of the amplifier's differential outputs and the other coupled to the other of the amplifier's differential outputs. This approach presents accuracy issues as the signal at each output pin of the amplifier measured against ground is not an accurate signal. Overhead is added in terms of space, complexity and cost to accommodate two ADCs and to address the accuracy issue.

A better solution is thus desirable. In this context, features and aspects of the present disclosure arise.

SUMMARY

In an example, a reconfigurable filter comprises first and second inputs adapted to receive an input signal; a fully differential amplifier (FDA); and first and second reconfigurable resistance-capacitance (RC) networks. The FDA has an inverting input, a non-inverting input, an inverting output, and a non-inverting output. The inverting input is coupled to the first input, and the non-inverting input is coupled to the second input. The first reconfigurable RC network is coupled to the non-inverting output, and the second reconfigurable RC network is selectively couplable to the inverting output. The reconfigurable filter is configurable to enable operation in any of multiple modes including a single-ended mode of operation and a differential mode of operation.

In an example, a system (e.g., which may be or include an isolated amplifier) comprises a digital-to-analog converter (DAC); a multiple feedback (MFB) filter; and a plurality of terminals including an output terminal, a multi-functional terminal, a voltage supply terminal, and a ground terminal. The DAC has a digital input, a DAC reference voltage input, a first output, and a second output. First and second inputs of the MFB filter are coupled to the first and second outputs of the DAC, respectively. The MFB filter includes a fully differential amplifier (FDA) having an inverting input, a non-inverting input, an inverting output, and a non-inverting output. The inverting input is coupled to the first input, and the non-inverting input is coupled to the second input. The MFB filter is configurable to enable an amplifier of the system to operate in any of multiple modes including a single-ended mode of operation and a differential mode of operation.

In an example, a method comprises controlling a first reconfigurable resistance-capacitance (RC) network of a filter of an amplifier to set the amplifier in a select mode of operation among multiple modes of operation; controlling a second reconfigurable RC network of the filter to set the amplifier in the select mode of operation; selecting a source of a reference voltage that is input to a digital-to-analog converter (DAC) of the amplifier based on the select mode of operation; and generating, by the amplifier, an output signal according to the select mode of operation.

These and other features will be better understood from the following detailed description with reference to the accompanying drawings.

BRIEF DESCRIPTION OF THE DRAWINGS

Features of the disclosure may be understood from the following figures taken in conjunction with the detailed description.

FIG. 4B is a diagram of another example isolated amplifier system including circuitry to enable direct coupling to a single-ended-input ADC.

DETAILED DESCRIPTION

Figure 1:
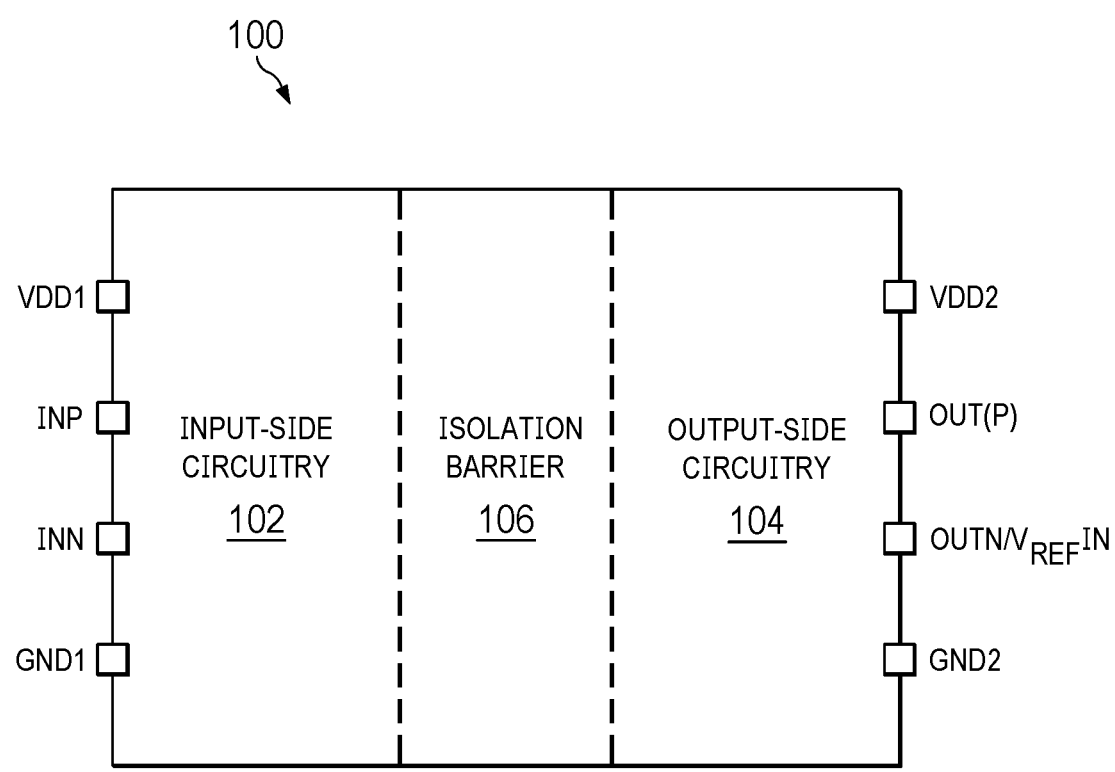
FIG. 1 is a diagram of an example isolated amplifier.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

In example arrangements, systems, circuits and methods provide an isolated amplifier with a multi-way reconfigurable MFB filter to enable the isolated amplifier to operate in any of multiple modes including a fully differential mode, a single-ended mode in which a single-ended ground-referenced output signal is generated from an input signal, which may be a differential input signal, as well as various unipolar modes. Circuitry is also provided to enable direct coupling of the single-ended output to a single-ended-input ADC and to scale the single-ended, ground-referenced output signal with a reference voltage that matches the full-scale range of the ADC. The reference voltage may be provided through a dedicated or shared terminal (or pin). The arrangements advantageously support multiple different products and applications.

FIG. 1 is a diagram of an example isolated amplifier 100, which includes input-side circuitry 102 for processing a differential signal input at terminals INP and INN of isolated amplifier 100. Its terminal VDD1 is adapted to be coupled to a high-side voltage supply, which may be 3.3 V or 5 V, referred to GND1. Terminal GND1 of isolated amplifier 100 is adapted to be coupled to high-side ground. Isolated amplifier 100 further includes output-side circuitry 104 that is separated from input-side circuitry 102 by an isolation barrier 106. On the output side, terminal VDD2 is adapted to be coupled to a low-side voltage supply, which may be, for example, 3.3 V or 5 V. Terminal GND2 is adapted to be coupled to low-side ground. In isolated amplifier 100, terminals OUT(P) and OUTN/$V_{REF}$IN serve multiple purposes. When isolated amplifier 100 is configured in differential mode, a differential output signal (OUTP−OUTN) is outputted at these terminals. When isolated amplifier 100 is configured in single-ended mode or in any of various unipolar modes, a single-ended output signal (OUT) is outputted at terminal OUT(P) referenced to GND2, while terminal OUTN/$V_{REF}$IN functions as an input for an externally-supplied reference voltage ($V_{REF}$IN) or midpoint reference. Thus, the OUTN/$V_{REF}$IN terminal may be considered a multi-functional terminal. A multiple feedback (MFB) filter is provided as part of output circuitry 104 to configure isolated amplifier 100 in its various modes and facilitate low-pass filtering following D/A conversion.

Figure 2:
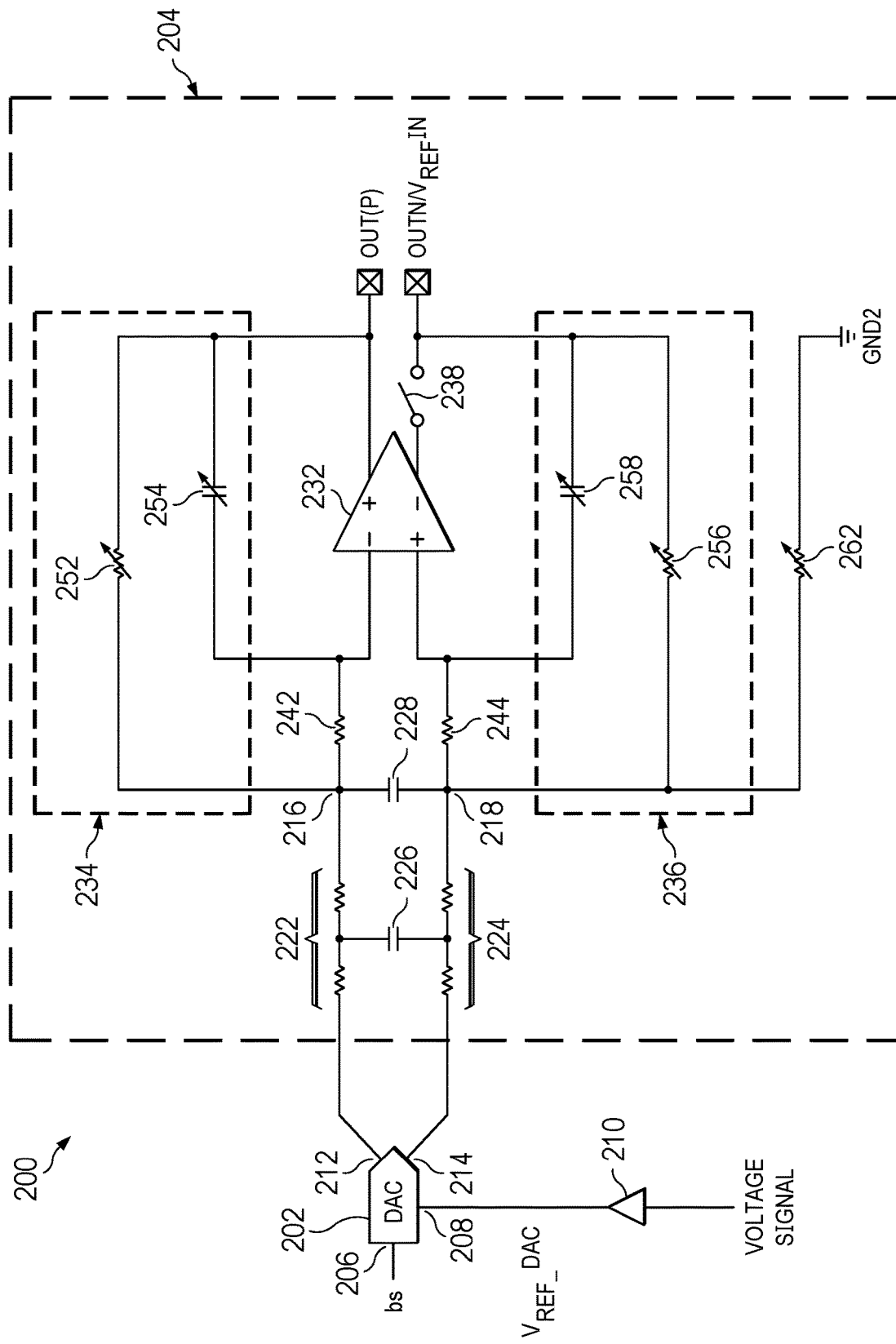
FIG. 2 is a diagram of an example filter system that includes an example multi-way reconfigurable multiple feedback (MFB) filter to enable an isolated amplifier to operate in any of multiple modes.

FIG. 2 is a diagram of an example of such a multi-way reconfigurable MFB filter (or filter component) 204 within a filter system 200. Filter system 200 also comprises a digital-to-analog converter (DAC) 202 that drives filter component 204. DAC 202 has a digital input 206 at which a bitstream (bs) is input, and a DAC reference voltage input 208 at which a DAC reference voltage ($V_{REF\_DAC}$) is input based on a voltage signal that may be sourced differently depending on the mode of operation. The voltage signal is input to DAC 202 through a buffer 210. DAC 202 is configured to output a differential analog signal at first and second outputs 212 and 214, respectively. The bitstream (bs) may be the output of an analog-to-digital converter (ADC) (not shown) at the input side of isolated amplifier 100.

The first and second outputs 212 and 214 of DAC 202 are coupled to respective first and second inputs 216 and 218 of filter component 204. First output 212 is coupled to first input 216 via a first pair of resistors 222, and second output 214 is coupled to second input 218 via a second pair of resistors 224. Each of the resistors of the first and second pairs may have a resistance which is multiple of R, where R denotes a unit value of resistance, or other suitable resistance consistent with the teachings herein. A capacitor 226 may be coupled between a first node between the resistors of the first pair and a second node between the resistors of the second pair. In another example, capacitor 226 may be omitted. Another capacitor 228 is coupled between first and second inputs 216 and 218 of filter component 204. Capacitor 226, when used, may have a capacitance of nC, where n is a factor and C denotes a unit value of capacitance. Capacitor 228 may have a capacitance of mC, where m is another factor that may be different than factor n. In some examples, the resistor in each of the first and second pairs that is coupled directly to DAC 202, as well as capacitor 226, may be separate from filter component 204.

Filter component 204 comprises a fully differential amplifier (FDA) 232 that can be reconfigured to drive OUTP only as an operational amplifier (op amp), a first reconfigurable resistance-capacitance (RC) network 234, and a second reconfigurable RC network 236. FDA 232 has an inverting input (−) and a non-inverting input (+), as well as an inverting output (−) and a non-inverting output (+). FDA 232 may be configured, via a switching mechanism, such that its inverting output can be deactivated (e.g., set to a high impedance state). This is exemplified by an external switch 238 coupled to the inverting output of FDA 232, although other techniques may be used to achieve deactivation. For example, one or more switches within FDA 232 may be employed to deactivate (float, tristate) OUTN without being series with that output. RC network 234 is coupled between the non-inverting output and the inverting input of FDA 232. In the external switch embodiment, RC network 236 is selectively couplable to inverting output of FDA 232 via switch 238 and is also coupled to the non-inverting input of FDA 232.

Filter component 204 further comprises first and second integrator resistors 242 and 244, respectively. First integrator resistor 242 is coupled between first input 216 of filter component 204 and the inverting input of FDA 232, and second integrator resistor 244 is coupled between second input 218 of filter component 204 and the non-inverting input of FDA 232. Being coupled to the inputs of FDA 232, integrating resistors 242 and 244 may also be referred to as input resistors.

First RC network 234 includes a first variable resistive element 252 and a first variable capacitive element 254. First variable resistive element 252 is coupled between the non-inverting output of FDA 232 and input 216 of filter component 204, while first variable capacitive element 254 is coupled between the non-inverting output of FDA 232 and its inverting input. First variable resistive element 252 represents one or more resistors that may be configured to provide a specific resistance between the non-inverting output of FDA 232 and input 216 of filter component 204. Similarly, first variable capacitive element 254 represents one or more capacitors that may be configured to provide a specific capacitance between the non-inverting output and the inverting input of FDA 232.

Second RC network 236 includes a second variable resistive element 256 and a second variable capacitive element 258 having input ends coupled to input 218 of filter component 204 and to the non-inverting input of FDA 232, respectively. In an example, the output ends of second variable resistive element 256 and second variable capacitive element 258 are selectively couplable to the inverting output of FDA 232 via switch 238. In another example, as described above, the inverting output of FDA 232 may be activated (e.g., by an internal mechanism) to thereby activate second RC network 236. As is the case with first variable resistive and capacitive elements 252 and 254, second variable resistive and capacitive elements 256 and 258, respectively, represents one or more components. That is, one or more resistors may be used to configure second variable resistive element 256 to provide a specific resistance in its electrical path, and one or more capacitors may be used to configure second variable capacitive element 258 to provide a specific capacitance in its electrical path.

Filter component 204 also includes a variable resistor 262, which may be one or more resistors, coupled between input 218 and a ground terminal (GND2). Terminal OUT(P) of filter component 204 is coupled to the non-inverting output of FDA 232. Terminal OUTN/$V_{REF}$IN functions as an output terminal (OUTN) when filter component 204 is configured in differential mode, in which case switch 238 is closed (in the external switch example), coupling such terminal to the inverting output of FDA 232. In single-ended mode, switch 238 (when used) is open, in which case OUTN/$V_{REF}$IN functions as an input terminal ($V_{REF}$IN).

In addition to switch 238 (or other mechanism for activating/deactivating the inverting output of FDA 232), first and second RC networks 234 and 236 may also be configured. An example structure and control scheme for RC networks 234 and 236 is shown with respect to reconfigurable MFB filter (or filter component) 304 in FIG. 3, which is shown in the context of an example filter system 300.

Figure 3:
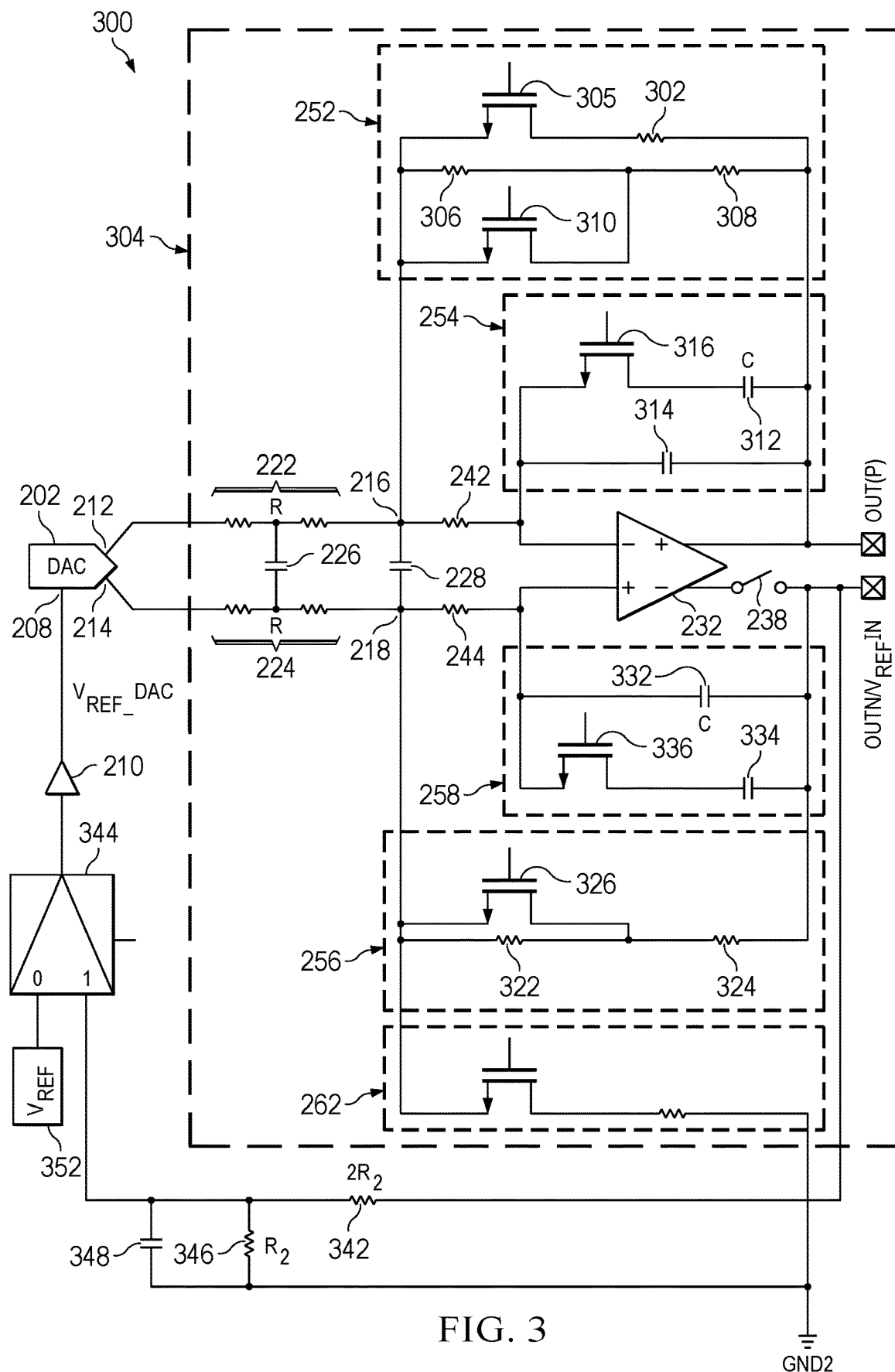
FIG. 3 is a diagram of another example filter system that includes an example multi-way reconfigurable MFB filter to enable an isolated amplifier to operate in any of multiple modes.

In addition to showing example structure and operation of variable resistive elements 252 and 256, as well as variable capacitive elements 254 and 258, FIG. 3 shows additional components of filter component 304 that are also used in configuring isolated amplifier 100. Components of filter component 304 that are the same as, or substantially similar to, those of filter component 204 are identified with the same reference numerals as their respective counterpart components of filter component 204.

In example filter component 304, variable resistive element 252 includes resistor 302 that is selectively couplable between input 216 of filter component 204 and the output terminal (OUT(P) via a switch 305, which may be in the form of an n-channel metal-oxide-semiconductor (NMOS) field-effect transistor (NMOS transistor). When switch 305 is ON (conducting), resistor 302 is coupled between input 216 and OUT(P); otherwise the path of resistor 302 and switch 305 is open. In the example of FIG. 3, resistive element 252 further includes a pair of resistors 306 and 308, which may be configured for series operation or for use of only resistor 308 with resistor 306 shorted. That is, (NMOS transistor) switch 310 is coupled across the terminals of resistor 306 to create a short circuit path when switch 310 is ON (conducting). Thus, by using switches 305 and 310, various different resistance values may be set for reconfigurable RC network 234, of which variable resistive element 252 is a part. In an example, the resistance of resistor 302 is 3 R, and the resistance of each of resistors 306 and 308 is 1.5 R with a series equivalent of 2×1.5 R when switch 310 is OFF.

Reconfigurable RC network 234 also includes variable capacitive element 254, which, in example filter component 304, includes capacitors 312 and 314, as well as (NMOS transistor) switch 316. Depending on whether switch 316 is ON or OFF, the capacitance between the OUT(P) terminal (also the non-inverting output terminal of FDA 232) and the inverting input terminal of FDA 232 may be the total capacitance of capacitors 312 and 314 coupled in parallel (2 C), or may be the capacitance of capacitor 314 (C).

Reconfigurable RC network 236 is similarly constructed, using switch control of multiple resistors and capacitors. In the illustrated example, variable resistive element 256 includes two resistors 322 and 324, as well as (NMOS transistor) switch 326. As configured, switch 326 may be used to set the resistance of reconfigurable RC network 236 to the sum of the resistances of resistors 322 and 324 (2×1.5 R), or simply the resistance of resistor 324 (1.5 R). In example filter component 304, variable capacitive element 258 of reconfigurable RC network 236 includes two capacitors 332 and 334, as well as (NMOS transistor) switch 336, which may be used to set the capacitance of reconfigurable RC network 236 to one of two different capacitances, i.e., C or 2 C.

In filter component 304, variable resistor 262 is implemented by a resistor and a switch coupled in series. In the illustrated example, variable resistor may have a value of 3 R or essentially infinite (∞) depending on whether the switch is closed or open.

Example filter component 304 further includes circuitry for switching the source of $V_{REF}$_DAC that is input to DAC 202. Such switching circuitry includes a resistor 342 coupled between terminal OUTN/$V_{REF}$IN and a first input of a two-input multiplexer 344. The switching circuitry further includes a resistor 346 coupled in parallel with a capacitor 348 between the first input of multiplexer 344 and ground (GND2). A voltage source ($V_{REF}$) 352 is coupled to the second input of multiplexer 344. The output of multiplexer 344 is coupled to the input of buffer 210, the output of which is coupled to the DAC reference voltage input 208. Multiplexer 344 selects the source of $V_{REF}$_DAC, depending on the mode of operation.

In an example, to configure amplifier 100 in differential mode to generate a differential output signal in response to a differential input signal, switch 238 is closed and reconfigurable RC networks 234 and 236 are configured as follows. In reconfigurable RC network 234, switch 310 is ON, switch 305 is ON, and switch 316 is ON, providing a resistance of 1.5 R and a capacitance of 2 C. In reconfigurable RC network 236, switch 326 is ON and switch 336 is ON, providing a resistance of 1.5 R and a capacitance of 2 C. In differential mode, the switch of variable resistor 262 is OFF, providing a resistance of infinity. Also, in differential mode, multiplexer 344 selects the input from voltage source 352 as the source of $V_{REF}$_DAC.

The table below shows example configurations for the differential input mode, as well as other modes, each of which may be obtained by controlling the switches of filter component 304. In all the modes except differential, switch 238 is open. $V_{REF}$_DAC is sourced through the $V_{REF}$IN terminal of amplifier 100 for ratiometric modes. In single-ended (SE) mode, with ratiometric scaling (ratio), and in the unipolar ratiometric mode, the voltage signal input to buffer 210 is $V_{REF}$IN/3, whereas in the other modes (fixed gain) the voltage signal input to buffer 210 is $V_{REF}$. In either the unipolar 1.5V/V mode or unipolar 1V/V mode, the output swing may be offset by $V_{REF}$IN or fraction thereof. The voltage $V_{clip}$ is the absolute clipping voltage of the high-side (INN–INP), and $V_{REF}$ is an internal reference voltage.

| MODE | Input Swing | Output Swing (V) | Resistive element 252 | Capacitive Element 254 | Resistive element 256 | Capacitive element 258 | Variable resistor 262 |
|---|---|---|---|---|---|---|---|
| Differential | ±$V_{clip}$ | ±1.5*$V_{REF}$ | 1.5R | 2C | 1.5R | 2C | ∞ |
| SE Ratio | ±$V_{clip}$ | 0→$V_{REF}$IN | 1.5R | 2C | 3R | 2C | 3R |

| MODE | Input Swing | Output Swing (V) | Resistive element 252 | Capacitive Element 254 | Resistive element 256 | Capacitive element 258 | Variable resistor 262 |
|---|---|---|---|---|---|---|---|
| Unipolar Ratio | 0→$V_{clip}$ | 0→$V_{REF}$IN | 3R | C | ∞ | C | 3R |
| Unipolar 1.5 V/V | 0→$V_{clip}$ | $V_{REF}$IN→3*$V_{REF}$ + $V_{REF}$IN | 3R | C | 3R | C | ∞ |
| Unipolar 1 V/V | 0→$V_{clip}$ | VREFIN→1.5*$V_{REF}$ + $V_{REF}$IN | 1.5R | 2C | 1.5R | 2C | ∞ |

FIG. 3 shows an example of how reconfigurable RC networks 234 and 236 may be structured. Other arrangements are possible consistent with the teachings herein. For example, a second-order MFB filter may be used, in which case capacitor 226 may be omitted. Each RC network may include any suitable combination of parallel and/or series coupled resistors, as well as any suitable combination of parallel and/or series coupled capacitors, along with controlling switches. Similarly, FIG. 3 shows an example configuration of variable resistor 262; however, it may be configured in any suitable way to obtain the desired resistance for a given mode of operation.

Figure 4A:
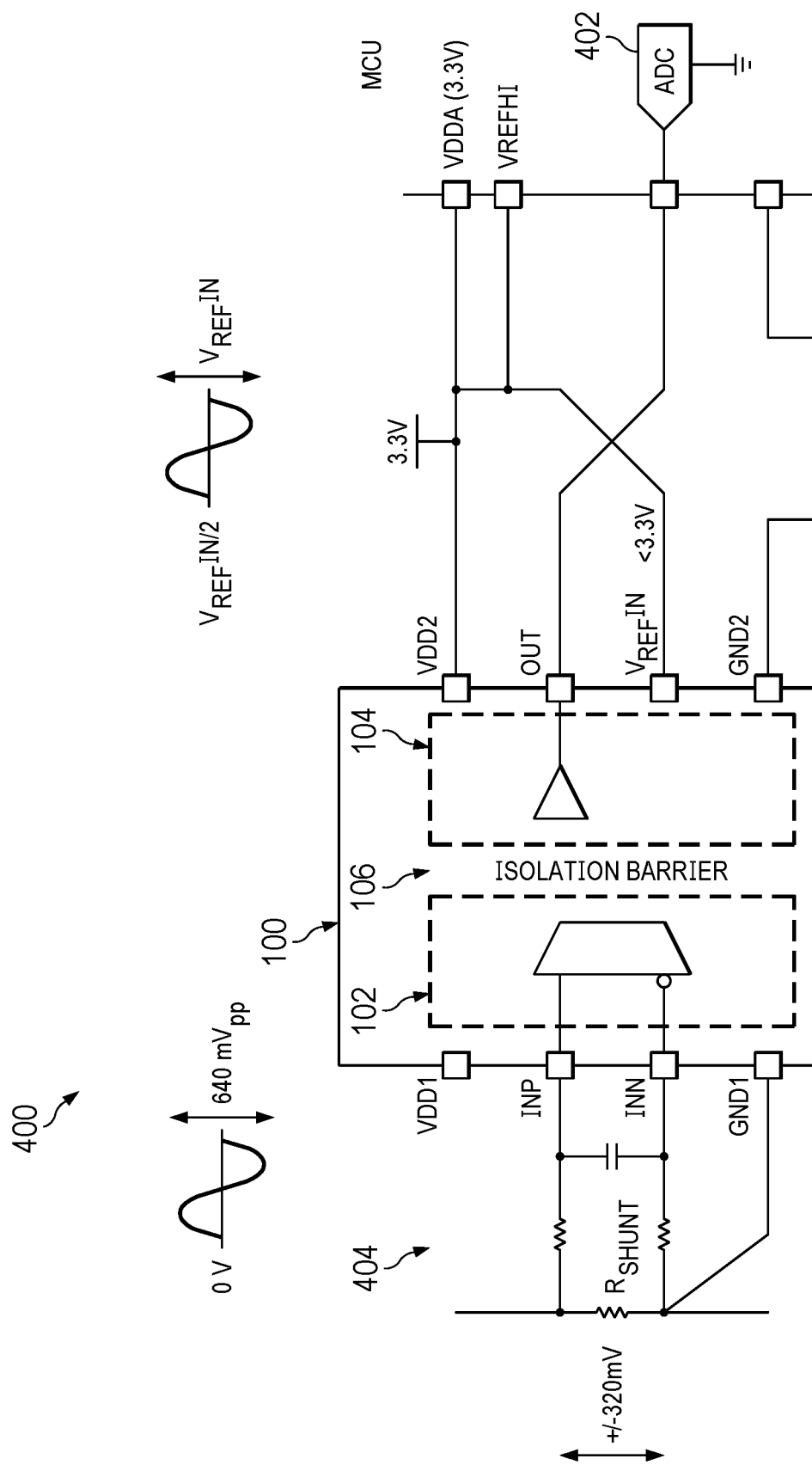
FIG. 4A is a diagram of an example isolated amplifier system including circuitry to enable direct coupling to a single-ended-input ADC.

FIGS. 4A and 4B show different examples of larger systems (i.e., environments) 400 and 450, respectively, in which an isolated amplifier 100 is configured in single-ended mode to generate, in response to a differential input signal, a single-ended, ground-referenced output signal at its output (OUT) that is coupled directly to a single-ended-input ADC 402, which may be part of a microcontroller unit (MCU). In both systems 400 and 450, the multi-functional terminal of isolated amplifier 100 (OUTN/$V_{REF}$IN) is configured as a reference input terminal ($V_{REF}$IN) to receive a reference voltage ($V_{REF}$).

Both systems 400 and 450 include input circuitry 404. In the examples of FIGS. 4A and 4B, input circuitry 404 includes a low-impedance shunt resistor ($R_{SHUNT}$) in a current path to generate an input signal delivered to input terminals INP and INN of isolated amplifier 100. One end of $R_{SHUNT}$ is coupled to the input-side ground terminal (GND1) of isolated amplifier 100. Input circuitry 404 may be different than that shown, depending on application. In the illustrated example, the differential input signal is approximately 640 mV peak-to-peak (pp).

In both systems 400 and 450, the input-side voltage supply terminal (VDD1) of isolated amplifier 100 may be coupled to a voltage supply (not shown). Also, in both systems 400 and 450, the output-side voltage supply terminal (VDD2) of isolated amplifier 100 is coupled to the voltage supply terminal (VDDA) of the MCU, and both such terminals are commonly coupled to a voltage supply, which may be within a range of approximately 2.7 V to 5.5 V, e.g., 3.3 V, and which may be different than the voltage supply of the input-side. The output-side ground terminal (GND2) and a ground terminal of the MCU are both coupled to a common ground. The voltages indicated in FIGS. 4A and 4B are examples.

In system 400 of FIG. 4A, the $V_{REF}$IN terminal is coupled to both a VREFHI terminal and the VDDA terminal of the MCU. In contrast, in system 450 of FIG. 4B, the $V_{REF}$IN terminal is only coupled to the VREFHI terminal, and a voltage source 452 is coupled between the $V_{REF}$IN terminal and the GND2 terminal. Voltage source 452 is configured to generate an external reference voltage ($V_{REF}$_EXT) that is supplied to isolated amplifier 100 via its $V_{REF}$IN terminal and to the MCU via its VREFHI terminal. In an example, $V_{REF}$_EXT may range between approximately 2.7 V and the voltage of VDD2; other ranges are possible. In an example, $V_{REF}$_EXT is less than the voltage supplied to VDD2 and VDDA.

The single-ended, ground-referenced output signal generated by each of systems 400 and 450 is scaled with the differential input signal (bipolar inputs). In the examples of FIGS. 4A and 4B, the output voltage of isolated amplifier 100 (V(OUT, GND2)) is substantially centered about $V_{REF}$IN/2. At zero input, amplifier 100 outputs approximately $V_{REF}$IN/2; in response to positive input signals, the output of amplifier 100 ranges between approximately $V_{REF}$IN/2 and $V_{REF}$IN; and in response to negative input signals, the output of amplifier 100 ranges between approximately $V_{REF}$IN/2 and ground (zero). Moreover, in example systems 400 and 450, V(OUT, GND2)≅(Vin*A+1)* ($V_{REF}$IN−GND2)/2, where Vin is $V_{INP}$−$V_{INN}$ and A represents a fixed gain value; in an example, A=1/$V_{clip}$. Other input/output signal combinations are possible. For example, in the case of unipolar fixed gain modes, the output voltage is driven as follows. At zero input, amplifier 100 outputs a value that closely follows $V_{REF}$IN or fraction thereof, and from positive input signals, amplifier 100 outputs between zero and A*$V_{REF}$, where A may be 1.5 or 3 in the examples in the table above.

Figure 5:
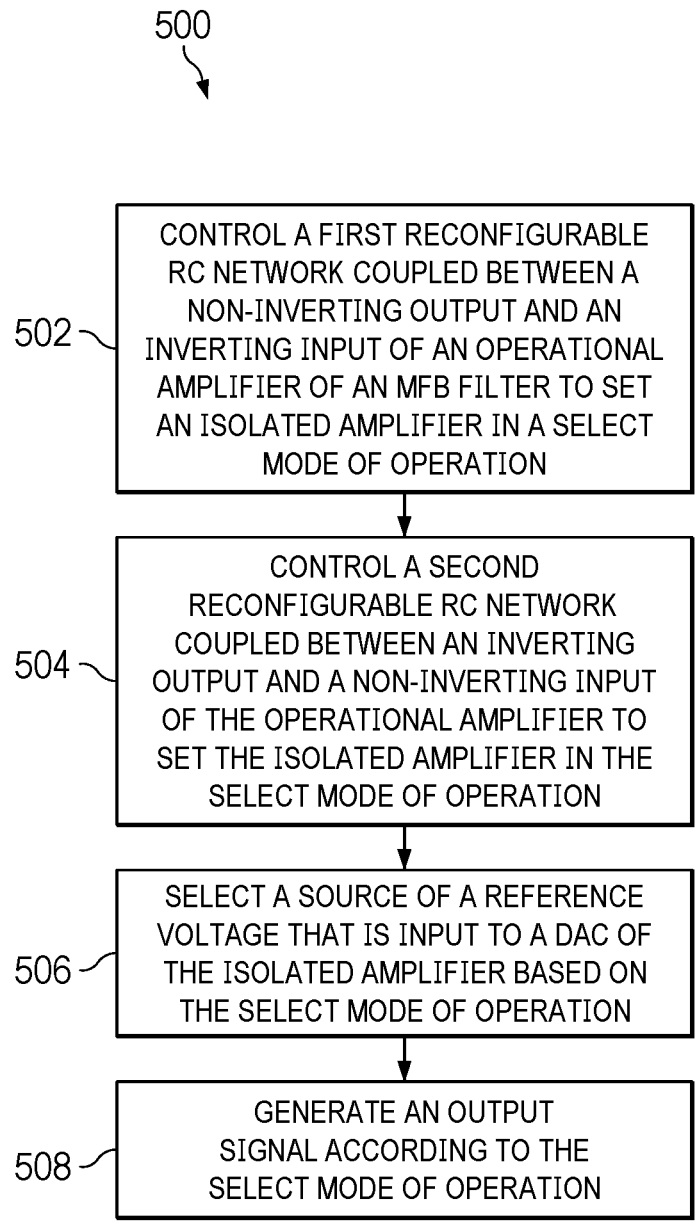
FIG. 5 is a flow diagram of an example method of setting an example multi-way reconfigurable MFB filter, such as that shown in FIG. 2 or 3, in a particular configuration to enable an associated isolated amplifier to operate in a specific mode.

FIG. 5 is a flow diagram of an example method 500 of operating an isolated amplifier (e.g., isolated amplifier 100) with a reconfigurable MFB filter (e.g., MFB filter 204 and/or 304).

In operation 502, a first reconfigurable resistance-capacitance (RC) network of a multiple feedback filter of an amplifier, e.g., an isolated amplifier, is controlled to set the amplifier in a select mode of operation among multiple modes of operation. In operation 504, a second reconfigurable RC network of the multiple feedback filter is controlled to set the amplifier in the select mode of operation. The controlling or configuring of the first and second reconfigurable RC networks may be carried via switches, e.g., NMOS transistors, as described above. In operation 506, a source of a reference voltage that is input into a digital-to-analog converter (DAC) of the amplifier is selected based on the select mode of operation. With the amplifier so configured, in operation 508, an output signal is generated according to the select mode of operation.

FIG. 5 depicts one possible set and order of operations. Not all operations need necessarily be performed in the order described. Some operations may be combined into a single operation. Additional operations and/or alternative operations may be performed.

Examples of circuitry, systems and methods provide a multi-way configurable isolated amplifier that supports unipolar and bipolar sensing applications. By employing a multi-way reconfigurable MFB filter, the amplifier is able to utilize the full dynamic range of the downstream ADC and therefore maximizes measurement resolution. No external circuitry is required to generate a single-ended output signal, thereby reducing board space, system cost. Advantageously, a single piece of silicon can be configured to operate in any of the modes described above. Measurement accuracy is also improved. Because of the ratiometric scaling at the output in single-ended mode and unipolar ratio mode, it is possible to suppress or cancel errors between the reference voltage of the host system and of the DAC reference voltage of the isolated amplifier. Gain and gain drift errors of the signal chain are defined only by the input-side circuits of the isolated amplifier.

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (i.e. programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, volatile or non-volatile memory elements, or a combination thereof.

As used herein, the terms "terminal" and "pin" also encompass "node", "interconnection" and/or "lead". Unless specifically stated to the contrary, these terms generally mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, etc.), and/or one or more sources (such as voltage and/or current sources) may instead include only the semiconductor elements within a single physical device (i.e. a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of n-channel MOSFETs is described herein, other types of transistors (or equivalent devices) may be used instead or in combination. Circuits described herein are reconfigurable to include the replaced components to provide functionality at least partially similar to functionality available prior to the component replacement.

Uses of the phrase "ground" in the foregoing description includes a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications of the described examples are possible, as are other examples, within the scope of the claims. Moreover, features described herein may be applied in other environments and applications consistent with the teachings provided.

What is claimed is:

1. First and second inputs adapted to receive an input signal;
    a fully differential amplifier (FDA) having an inverting input, a non-inverting input, an inverting output and a non-inverting output, the inverting input coupled to the first input and the non-inverting input coupled to the second input;
    a first reconfigurable resistance-capacitance (RC) network coupled to the non-inverting output;
    a second reconfigurable RC network selectively couplable to the inverting output; and
    a variable resistor coupled between the second input and ground, a resistance of the variable resistor being set based on a selected mode of operation;
    wherein the reconfigurable filter is configurable to enable operation in any of multiple modes including a single-ended mode of operation and a differential mode of operation.

2. The reconfigurable filter of claim 1, further comprising:
    a first input resistor coupling the first input to the inverting input of the FDA; and
    a second input resistor coupling the second input to the non-inverting input of the FDA,
    wherein the first reconfigurable RC network is coupled across the first input resistor, and the second reconfigurable RC network is coupled across the second input resistor.

3. The reconfigurable filter of claim 2, wherein the first reconfigurable RC network comprises a first capacitive element coupled between the non-inverting output of the FDA and the inverting input of the FDA, and a first resistive element coupled between the non-inverting output of the FDA and the first input of the reconfigurable filter.

4. The reconfigurable filter of claim 3, wherein the second reconfigurable RC network comprises a second capacitive element selectively couplable between the inverting output of the FDA and the non-inverting input of the FDA, and a second resistive element selectively couplable between the inverting output of the FDA and the second input of the reconfigurable filter.

5. The reconfigurable filter of claim 1, further comprising:
    a switching mechanism configured to selectively couple the second reconfigurable RC network to the inverting output of the FDA,
    the switching mechanism configured to be set in a first configuration to provide a differential output signal at an output terminal and a multi-functional terminal of an amplifier associated with the reconfigurable filter, the output terminal coupled to the non-inverting output of the FDA and the inverting output coupled to the multi-functional terminal, and
    the switching mechanism configured to be set in a second configuration to provide a single-ended output signal at the output terminal, and decouple the multi-functional terminal from the inverting output of the FDA and enable the multi-functional terminal to receive a reference voltage signal.

6. The reconfigurable filter of claim 5, wherein the switching mechanism comprises a plurality of switches within the FDA to selectively activate and deactivate the inverting output of the FDA.

7. The reconfigurable filter of claim 5, wherein the switching mechanism comprises a switch configured to selectively couple the inverting output of the FDA to the multi-functional terminal.

8. The reconfigurable filter of claim 5, wherein the first reconfigurable RC network, the second reconfigurable RC network, and the switching mechanism are configurable in a first setting to provide a single-ended output signal at the output terminal in the single-ended mode of operation.

9. The reconfigurable filter of claim 8, wherein the first reconfigurable RC network, the second reconfigurable RC network, and the switching mechanism are configurable in a second setting to provide a differential output signal at the output terminal and the multi-functional terminal in the differential mode of operation.

10. The reconfigurable filter of claim 4, wherein:
the first capacitive element includes a plurality of first output capacitors and a first output capacitance switch;
the first resistive element includes a plurality of first output resistors and a first output resistance switch;
the second capacitive element includes a plurality of second output capacitors and a second output capacitance switch; and
the second resistive element includes a plurality of second output resistors and a second output resistance switch.

11. A system comprising:
a digital-to-analog converter (DAC) having a digital input, a DAC reference voltage input, a first output and a second output; and
a multiple feedback (MFB) filter having first and second inputs coupled to the first and second outputs of the DAC, respectively, the MFB filter including a fully differential amplifier (FDA) having an inverting input, a non-inverting input, an inverting output and a non-inverting output, the inverting input coupled to the first input and the non-inverting input coupled to the second input; and
a plurality of terminals including an output terminal, a multi-functional terminal, a voltage supply terminal, and a ground terminal;
wherein the MFB filter is configurable to enable an amplifier of the system to operate in any of multiple modes including a single-ended mode of operation and a differential mode of operation;
wherein, in the single-ended mode of operation, the MFB filter is configured to generate a single-ended output signal at the output terminal;
wherein the MFB filter is configurable to scale the single-ended output signal with a reference voltage signal input to the multi-functional terminal, the generated single-ended output signal being based on an input voltage to the system and a difference between the reference voltage signal and a ground voltage.

12. The system of claim 11, wherein the single-ended output signal is referenced to a voltage at the multi-functional terminal.

13. The system of claim 11, wherein, in the differential mode of operation, the MFB filter is configured to generate a differential output signal at the output terminal and the multi-functional terminal.

14. The system of claim 11, wherein the single-ended output signal is suitable for input to a single-ended-input analog-to-digital converter.

15. A system comprising:
a digital-to-analog converter (DAC) having a digital input, a DAC reference voltage input, a first output and a second output; and
a multiple feedback (MFB) filter having first and second inputs coupled to the first and second outputs of the DAC, respectively, the MFB filter including a fully differential amplifier (FDA) having an inverting input, a non-inverting input, an inverting output and a non-inverting output, the inverting input coupled to the first input and the non-inverting input coupled to the second input; and
a plurality of terminals including an output terminal, a multi-functional terminal, a voltage supply terminal, and a ground terminal;
wherein the MFB filter is configurable to enable an amplifier of the system to operate in any of multiple modes including a single-ended mode of operation and a differential mode of operation;
further comprising:
a multiplexer having a first input coupled to the multi-functional terminal and configured to receive a first reference voltage signal and a second input coupled to reference voltage source and configured to receive a second reference voltage signal; and
a buffer having an input coupled to an output of the multiplexer and an output coupled to the DAC reference voltage input.

16. A method comprising:
controlling a first reconfigurable resistance-capacitance (RC) network of a filter of an amplifier to set the amplifier in a select mode of operation among multiple modes of operation;
controlling a second reconfigurable RC network of the filter to set the amplifier in the select mode of operation;
selecting a source of a reference voltage that is input to a digital-to-analog converter (DAC) of the amplifier based on the select mode of operation; and
generating, by the amplifier, an output signal according to the select mode of operation;
wherein the selecting of the source of a reference voltage that is input to a digital-to-analog converter (DAC) of the amplifier includes:
controlling a switch of the filter to configure a terminal of the amplifier as an output terminal or an input terminal based on the select mode of operation.

17. The method of claim 16, wherein the controlling of the first reconfigurable RC network includes:
controlling a first switch associated with a resistive element of the first reconfigurable RC network to set a resistance thereof; and
controlling a second switch associated with a capacitive element of the first reconfigurable RC network to set a capacitance thereof.

18. The method of claim 17, wherein the controlling of the second reconfigurable RC network includes:
controlling a third switch associated with a resistive element of the second reconfigurable RC network to set a resistance thereof; and
controlling a fourth switch associated with a capacitive element of the second reconfigurable RC network to set a capacitance thereof.

19. The method of claim 16, further comprising:
setting a variable resistor of the filter based on the select mode of operation,
wherein the filter is a multiple feedback filter.

20. The method of claim 16, further comprising:
setting a variable resistor of the filter based on the select mode of operation,
wherein the amplifier is an isolated amplifier.

* * * * *